(12) United States Patent
Elian et al.

(10) Patent No.: US 11,275,110 B2
(45) Date of Patent: Mar. 15, 2022

(54) SEMICONDUCTOR PACKAGE WITH PREDICTIVE SAFETY GUARD

(71) Applicant: Infineon Technologies AG, Neubiberg (DE)

(72) Inventors: Klaus Elian, Alteglofsheim (DE); Rainer Markus Schaller, Saal a.d. Donau (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/849,868

(22) Filed: Apr. 15, 2020

(65) Prior Publication Data
US 2021/0325454 A1 Oct. 21, 2021

(51) Int. Cl.
*G01R 31/28* (2006.01)
*G01R 31/52* (2020.01)

(52) U.S. Cl.
CPC ..... *G01R 31/2896* (2013.01); *G01R 31/2874* (2013.01); *G01R 31/52* (2020.01)

(58) Field of Classification Search
CPC . G01R 31/2896; G01R 31/2874; G01R 31/52
See application file for complete search history.

(56) References Cited

U.S. PATENT DOCUMENTS

| 9,494,657 | B2* | 11/2016 | Khan | H02S 50/10 |
| 9,726,554 | B1* | 8/2017 | Ghantous | G01K 13/00 |
| 9,739,824 | B2 | 8/2017 | Graas et al. | |
| 2006/0109034 | A1 | 5/2006 | Okitsu | |
| 2006/0139822 | A1 | 6/2006 | Kurita et al. | |
| 2008/0197870 | A1 | 8/2008 | Koerner | |
| 2014/0103937 | A1* | 4/2014 | Khan | H02S 50/10 |
| | | | | 324/509 |
| 2014/0214354 | A1 | 7/2014 | Dreifus et al. | |
| 2016/0258994 | A1 | 9/2016 | Graas et al. | |
| 2017/0108552 | A1* | 4/2017 | Roumi | G01R 31/367 |
| 2017/0331162 | A1* | 11/2017 | Clarke | H02J 7/00714 |
| 2018/0313893 | A1* | 11/2018 | Fiore | G01R 31/2851 |

(Continued)

FOREIGN PATENT DOCUMENTS

EP 1398639 A2 3/2004

OTHER PUBLICATIONS

Morris, "New Sendyne IC and module monitors ground fault, isolation, current, voltage and temperature," chargedevs.com, Apr. 13, 2016, 3 pp.

(Continued)

*Primary Examiner* — Dominic E Hawkins
(74) *Attorney, Agent, or Firm* — Shumaker & Sieffert, P.A.

(57) ABSTRACT

The disclosure describes techniques for detecting failures or performance degradation of a device including an integrated circuit (IC) components in the field by including additional contacts, i.e. terminals, along with functional contacts of the circuit used for connecting the circuit to a system in which the circuit is a part. These additional contacts may be internal external to the package surface and may be used to measure dynamic changing electrical characteristics over time e.g. voltage, current, capacity, temperature and impedance. These electrical characteristics may be representative of one or more failure modes and may be treated as indicator for device state-of-health (SOH).

19 Claims, 7 Drawing Sheets

(56) References Cited

U.S. PATENT DOCUMENTS

2018/0348304 A1* 12/2018 Tang .................... G01R 31/382
2019/0162745 A1* 5/2019 Otsuki .................... G01P 1/023

OTHER PUBLICATIONS

"AND8231-D,Circuit Configuration Options for TVS Diodes," onsemi.com, Mar. 2017, 5 pp.
"IDDQ Testing Made Easy," Systems Science, Inc., Jan. 2, 1997, 32 pp.
"IDDQ Testing," anysilicon.com, Mar. 31, 2016, 1 pp.
"IDDQ Tutorial," Digital Test Methods, Chapter 13, 1997 (Applicant points out, in accordance with MPEP 609.04(a), that the year of publication, 1997, is sufficiently earlier than the effective U.S. filing date, so that the particular month of publication is not in issue.) pp. 13/1-13/30.
"Thermal Copper Pillar Bump," Wikipedia, the free encyclopedia, retrieved from https://en.wikipedia.org/wiki/Thermal_copper_pillar_bump, May 21, 2019, 3 pp.
Blanchard et al., "Using ESD Diodes as Voltage Clamps," analog.com, retrieved from https://www.analog.com/en/analog-dialogue/articles/esd-diodes-as-voltage-clamps.html on Feb. 20, 2019, 12 pp.
Duvvury et al., "ESD Protection Device Issues For IC Designs," Proceedings of the IEEE 2001 Custom Integrated Circuits Conference (Cat. No 01CH37169), May 9, 2001, pp. 41-48.
Frenzel, "Save Your ICs from Dreaded ESD," electronicdesign.com, May 8, 2018, 11 pp.
Keim, "How to Use a Diode as a Thermometer," allaboutcircuits.com, Feb. 16, 2018, 6 pp.
Tsai et al., "An Efficient RDL Routing for Flip-Chip Designs," edn.com, Aug. 20, 2013, 3 pp.
U.S. Appl. No. 16/849,868, filed Apr. 15, 2020, naming inventors Klaus et al.
Office Action from U.S. Appl. No. 16/849,931, dated Jan. 19, 2022, 11 pp.

* cited by examiner

SEMICONDUCTOR PACKAGE WITH PREDICTIVE SAFETY GUARD

TECHNICAL FIELD

The disclosure relates to field reliability testing of integrated circuits.

BACKGROUND

The performance of semiconductor devices may degrade or fail during operational use, which is sometimes called a field failure. In some examples, the performance of a semiconductor device may degrade over time without a detectable field failure. In applications requiring high reliability, such as commercial aircraft, automobiles, trains, power grids and similar applications, reliability concerns may be mitigated, for example by replacing certain components at regular intervals. Scheduled replacement, however, can be expensive, and scheduled replacement of semiconductor components may occur for components that are still fully functional.

In other examples, components used in high reliability applications may be subject to stringent design and testing requirements, which may significantly increase the component cost.

SUMMARY

In general, the disclosure is directed to techniques for detecting field failures or performance degradation of integrated circuit (IC) components by including additional contacts, i.e. terminals, along with functional contacts used for connecting the IC to a system in which the IC is a part. These additional contacts may be inside the IC package or external to the package surface and may be used to measure dynamic changing electrical characteristics over time e.g. voltage, current, capacity, temperature and impedance. These electrical characteristics may be representative of one or more failure modes and may be treated as indicator for product state-of-health (SOH) either inside the IC or by a signal to a system that includes the IC.

In one example, the disclosure describes a device comprising an IC configured to perform one or more circuit operations, and a plurality of external terminals including a first terminal and a second terminal. The plurality of external terminals is configured to provide electrical connections to the IC, and to provide a measurement of an electrical characteristic between the first terminal and the second terminal while the IC is performing the one or more circuit operations, and wherein the measured electrical characteristic indicates a state of health (SOH) of the device.

In another example, the disclosure describes a system comprising: an IC device configured to perform one or more circuit operations, the IC device comprising a plurality of external terminals including a first terminal and a second terminal. The plurality of external terminals is configured to provide electrical connections to the integrated circuit and the first terminal of the plurality of terminals is configured to provide a measurement of an electrical characteristic between the first terminal and the second terminal while the IC is performing the one or more circuit operations. The measured electrical characteristic indicates a state of health (SOH) of the device. The system further comprises a measuring circuit configured to determine the electrical characteristic, wherein the electrical characteristic determines one or more of a voltage, a current, an impedance and a temperature.

In another example, the disclosure describes a method comprising: measuring, by a measuring circuit, an electrical characteristic between a first terminal and a second terminal of an IC at a first time. The first terminal and the second terminal are terminals of the IC configured to provide electrical connections to the IC, and wherein the IC is configured to perform one or more circuit operations. The method further comprises measuring, by a measuring circuit, the electrical characteristic between the first terminal and the second terminal of the IC at a second time different from the first time, comparing the measured electrical characteristic at the first time to the electrical characteristic at the second time, and determining, based on the comparison, a state of health (SOH) of the IC, while the IC is performing the one or more circuit operations.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques for detecting field failures or performance degradation of integrated circuit (IC) components by including additional test contacts, i.e. test terminals, along with the functional contacts. These additional contacts may be inside the IC package or external to the package surface and are used to measure dynamic changing electrical properties over time e.g. voltage, current, capacity, temperature or impedance. These electrical characteristics may be representative of certain failure modes and may be used, either inside the IC or by a signal to a system that includes the IC, as indicator for product state-of-health (SOH). Some examples of issues that may cause component degradation or eventual failure may include vibration, extreme changes in temperature, and moisture, to name a few.

In some examples, long-term thermal changes may induce metal phase change separation, cause void generation within the IC package, delamination and breakage of electrical connections such as wire bonds and solder bonds connecting the IC package to a system. The field environment may also cause long-term induced degradation of package materials, e.g. mold materials and glues but also metal plating. Package material degradation may contribute to humidity penetrating the IC package and possibly accelerate corrosion effects inside the package. In other examples, metal migration effects may lead to short circuits internally, or between IC terminals connected by solder or wire bonds to the system.

To protect against electrostatic discharge (ESD), ICs may include ESD protection diodes to clamp ESD voltages to a non-damaging level. In some examples, existing ESD protection diodes may be used to measure electrical characteristics of the IC, such as temperature. For example, an additional contact on the IC may be used to measure the IC temperature by monitoring a voltage on one or more ESD diodes. The temperature may be compared to a temperature range or threshold to detect errors and temperature changes caused by increasing resistance on terminal bonds caused by crack formation that may creep or propagate through the electrical joint over time.

In some examples, ICs may include built in self-test (BIST), cyclic redundancy checks (CRC) and other tests to ensure function of the IC. In other examples, systems in high reliability applications may include additional sensors and testing capability for early detection of failures or degradation of system components. However, the techniques of this disclosure may use additional structures added to the IC to provide detectability of failure modes that existing techniques would not be able to detect.

Figure 1:
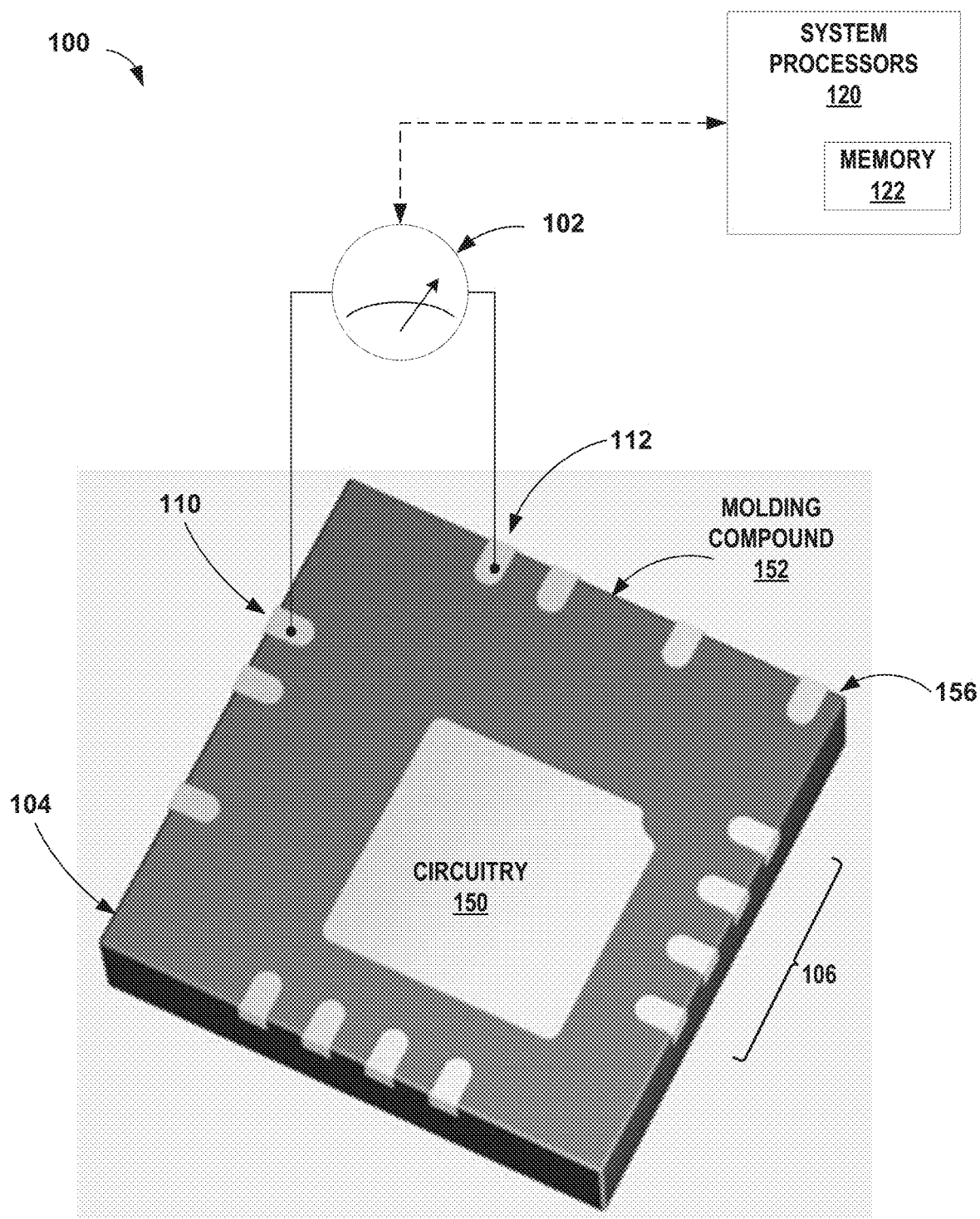
FIG. 1 is a conceptual diagram illustrating a system for measuring an electrical characteristic between two terminals of an integrated circuit (IC) according to one or more techniques of this disclosure.

FIG. 1 is a conceptual diagram illustrating a system for measuring an electrical characteristic between two terminals of an IC according to one or more techniques of this disclosure. While device performance may be measured in a test environment, such as during manufacturing, the techniques of this disclosure provide information about the SOH of a device while the device is operating in the field. Some examples of test environments through various manufacturing stages may include wafer testing of multiple integrated circuits on a silicon wafer. When the IC is cut from the wafer, other testing may include testing the IC when the IC is connected to a leadframe or similar assembly and the testing may be conducted before and after a mold compound is applied to the IC package. Other test environments may include circuit board testing, after assembling the IC package to a circuit, system testing, after connecting the circuit to a system, and overall product testing before shipping a final product. The test environment may include automated test equipment (ATE) to run a series of test on a device or an assembly that includes the device. The techniques of this disclosure may be advantageous during later assembly stages in a test environment, but further, the techniques of this disclosure may be a desirable for devices performing one or more circuit operations while in the field outside of the test environment and may not need additional sensors and testing capability for early detection of failures or degradation of system components needed by other techniques.

In the example of system 100 depicted in FIG. 1, device 104 includes circuitry 150 configured to perform one or more circuit operations. Circuitry 150 may be an IC in some examples. In other examples circuitry 150 may include one or more ICs along with one or more additional components that are part of device 104. Circuitry 150 may be configured to perform the one or more circuit operations to execute functions designed for device 104. The functions of device 104 may be anything performed by an IC in a system, e.g. a system on chip, an application specific integrated circuit (ASIC), a microcontroller, a multiplexor and so on that performs sensing, warnings, display functions, power supply and any number of other functions.

Device 104 may include a plurality of external terminals such as terminals 106 and corner terminal 156, which are configured to provide electrical connections to circuitry 150. For example, terminals 106 may electrically and mechanically connect to a circuit board, a leadframe, piggy-back on another IC package and so on. The external terminals may provide power, a reference voltage such as a circuit ground, input and output signals and other signals to and from circuitry 150 to other components of system 100 (not shown in FIG. 1). In some examples, one or more of external terminals 106 may provide only a mechanical connection to secure device 104 and have no electrical connections. Some examples of external terminals may be subject to greater mechanical stress than other terminals, such as corner terminal 156, and may be more likely to be subject to weakened electrical bonds, such as a cracked solder connection. Weakened bonds may result in open circuit for an external terminal. In this disclosure, external terminals may also be referred to as leads or contacts, e.g. electrical contacts.

In some examples, the external terminals of device 104 may be defined by a leadframe coupled to circuitry 150. In other examples, device 104 may be a circuit package including the IC and the plurality of external terminals.

In some examples device 104 may include a molding compound 152, or similar material to isolate and protect the components of the circuit package, such as circuitry 150, and the leadframe. Molding compound 152 may be made of a variety of materials such as epoxy, organic compounds, ceramic materials and similar materials. Molding compound 152 may provide mechanical rigidity, electrical isolation, resistance from humidity, and other protective features.

The measuring circuit of system 100, measurement circuitry 102 may connect to one or more external terminals of device 104, while circuitry 150 is performing the one or more circuit operations. In contrast to BIST, or testing during manufacturing, measurement circuitry 102 is configured to measure one or more electrical characteristics that may provide an indication of the state of health of device 104 while in the field. In the example of FIG. 1, measurement circuitry 102 connects to external terminals 110 and 112 and may measure one or more electrical characteristics between terminals 110 and 112. Some examples of electrical characteristics may include an AC impedance, a resistance, a voltage, a temperature and other characteristics. In some examples, terminal 110 and terminal 112 may each be functional terminals configured to conduct electrical signals between system 100 and one or more functional blocks of circuitry 150 while device 104 is performing the one or more circuit operations outside of a test environment.

In some examples, device 104 may also include one or more internal terminals (not shown in FIG. 1). An internal terminal may be configured to connect to measurement circuitry 102 and provide a measurement of another electrical characteristic, such as between the terminal 110 and the internal terminal. The electrical characteristic measured from the internal terminal, may for example, determine an amount of leakage between terminal 110 and the internal terminal.

In some examples, device 104 may be a large, expensive device with numerous external terminals, and a high end molding compound. In other examples device 104 may include smaller devices in system critical applications, such as power switches that control a power supply to system 100. In other examples, device 104 may include less expensive devices in applications such as secondary functions that, if the device fails, the system could continue to operate. In some examples, the functions of measurement circuitry 102 may be implemented by a component of system 100 that may be controlled by one or more processors 120 of system 100. In other examples, device 104 may include processing circuitry configured to receive a signal from measurement circuitry 102 indicating a value of the electrical characteristic. Measurement circuitry 102 may be implemented as one or more sub-circuits within circuitry 150 may be configured to determine the SOH based on the measured electrical characteristic. Device 104 may output a signal indicating the SOH to the one or more processors 120 of system 100, while the device is performing the one or more circuit operations in the field. In other examples, a dedicated measurement circuit, which may be implemented as an IC (not shown in FIG. 1), may be included in system 100 and include measurement circuitry 102, a processor, logic circuitry, communication circuitry, and other components to measure and determine the SOH of device 104. The one or more processors (internal or external to device 104) may cause measurement circuitry 102 to measure the electrical characteristic between terminals 110 and 112 based on, for example one or more triggering events, an expired time period, e.g. once per minute, or based on some other factor.

In some examples the SOH can be determined by a single measurement. In other examples, the SOH may be determined by comparing a change in the measurement of the electrical characteristic over at least two different times. In some examples, the SOH may depend on a particular device in a particular application. A similar device in two different applications may have different threshold limits for a given electrical characteristic. For example, a device that is involved in an interior lighting for an automobile may have less stringent requirements than a device that is part of a flight control system for an aircraft. A threshold limit for the characteristic of leakage may be more stringent for the aircraft, or for a stability control system for an oil drilling platform, than for less critical applications. In some examples, the one or more processors 120 of system 100 may compare measured characteristics to one or more threshold limits stored at a memory location, such as memory 122. System 100 may determine the SOH of device 104 based on the comparison. In some examples, system 100 may determine that the SOH of device 104 indicates that device 104 should be replaced, e.g. because device 104 may be at risk of failure.

In other examples, device 104 may include measurement circuitry 102 and output signals to system 100 indicating a value of a measured electrical characteristic. In some examples, device 104 may be configured to measure the electrical characteristic, such as resistance, by running a test program triggered by a signal external to device 104, such as a signal from processors 120. System 100 may compare the values to threshold limits to determine the SOH of device 104. In other examples, processing circuitry that is included in device 104 may determine the SOH based on the measured electrical characteristic and output a signal to system 100 indicating the SOH of device 104, while device 104 is performing the one or more circuit operations. In some examples, the one or more processors 120, may determine whether device 104 should be replaced. In other examples, the dedicated measurement circuit may measure one or more electrical characteristics between one or more terminals of device 104 and output a signal indicating the SOH of device 104.

In some examples, device 104 may be configured to operate in an operational mode, a manufacturing test mode and an operational test mode. For example, device 104 may function in manufacturing test mode and be coupled to automated test equipment at various stages of manufacturing, such as a bare die, assembled as a circuit package, as part of a sub-assembly or a complete system. In some examples device 104 may function in an operational test mode in which device 104 may be configured to continue to perform the one or more circuit operations, as designed, but also may receive signals from measurement circuitry 102 that measure the electrical characteristic between terminals 110 and 112, such as AC impedance, resistance, voltage, temperature and other characteristics as described above. In some examples, device 104 may function in operational mode while device 104 performs the one or more circuit operations in the field without a separate operational test mode and still receive signals from measurement circuitry 102 to measure the electrical characteristic. As noted above, measurement circuitry 102 may be internal to device 104, or an external circuit controlled by system 100, during any of operational mode, manufacturing test mode or operational test mode.

A device that includes the techniques of this disclosure may provide advantages over other techniques. In some examples, a device may be expensive and difficult to replace in the field. For devices that provide important functions, such as safety, navigation, and functions that require a system to shut down for a period in the event of malfunction, scheduled replacement to ensure reliability may be expensive. Also scheduled replacement of semiconductor components may occur for components that are still fully functional. The techniques of this disclosure may provide an indication of a SOH of a device that may not be provided, for example by BIST, or other testing.

The techniques of this disclosure may detect leakage, increased resistance, unexpected changes in operating temperature and other electrical characteristics that may signal a deteriorating state of health. The techniques of this disclosure enable system designers to take measurements and set threshold limits that depend on the particular application and environment in which the device may operate in the field. In this manner a device may be scheduled for replacement based on objective thresholds rather than based on an estimated time, such as a statistical mean time between failure (MTBF). Additional advantages may include providing the external leads and internal contacts in a device during manufacturing of the device to provide system designers the ability to take measurements without the need for adding additional system sensors and leads to measure leakage, temperature and other electrical characteristics.

Figure 2:
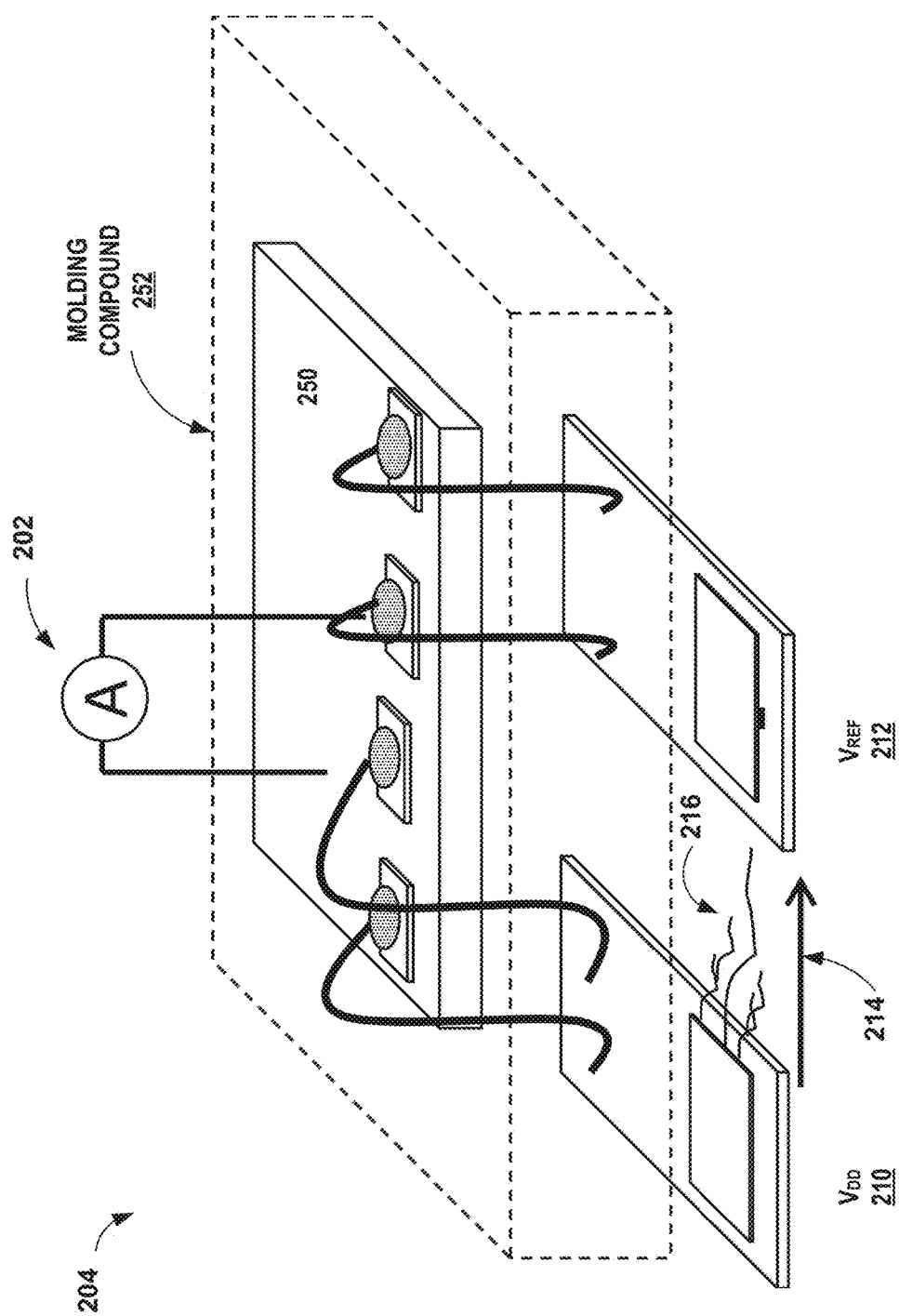
FIG. 2 is a conceptual diagram illustrating an IC configured to measure an electrical characteristic between two terminals of an IC according to one or more techniques of this disclosure.

FIG. 2 is a conceptual diagram illustrating an IC configured to measure an electrical characteristic between two terminals of an IC according to one or more techniques of this disclosure. Device 204 and measurement circuitry 202 are examples of device 104 and measurement circuitry 102 described above in relation to FIG. 1 configured to determine the SOH of device 204 by measuring electrical characteristics between two or more terminals.

The example of FIG. 2 depicts device 204 with IC 250, external terminals Vdd 210 and Vref 212 and protected by an encapsulant configured to seal IC 250 such that the plurality of external terminals provides the only electrical connections to IC 250. IC molding compound 252 is the encapsulant for device 204 and may be implemented by an organic compound, ceramic, resin or similar material. External terminals Vdd 210 and Vref 212 are the functional terminals configured to conduct electrical signals to and from functional blocks of IC 250 while IC 250 is performing one or more circuit operations.

In the example of FIG. 2, terminal Vdd 210 connects to a power supply and may provide power for IC 250. Vref 212 connects to a reference voltage, such as a signal ground. Measurement circuitry 202 connects between external terminals Vdd 210 and Vref 212. In other examples measurement circuitry 202 may configured to electrically connect between any internal terminals (not shown in FIG. 2) and external terminals, such as external terminals 106 and 156 described above in relation to FIG. 1. Measurement circuitry 202 may be external or internal to device 204 and may be configured to output a signal indicating the measured electrical characteristic while IC 250 is performing one or more circuit operations, e.g. in a system the field. Device 204 may be exposed to environmental conditions such as temperature changes, humidity, mechanical vibration and so on.

By measuring an electrical characteristic, such as a resistance, measurement circuitry 202 may detect a change in resistance between terminals Vdd 210 and Vref 212, which may be caused by metal migration 216, for example along the surface of a leadframe or circuit board. For example, silver ions (Ag+ ions) may form dendrites or similar structures causing a leakage current 214. In some examples, processing circuitry, such as processors 120 described above in relation to system 100, may receive a signal from measurement circuitry 202 indicating a value of the resistance, or other electrical characteristic. The processing circuitry may determine the SOH based on the measured electrical characteristic compared to a threshold. For example, the processing circuitry may determine a resistance that exceeds a threshold value, for example a resistance greater than one ohm, indicates that the state of health has deteriorated enough for the device to be replaced. In other examples, the processing circuitry may determine that a change in an electrical characteristic over a time period indicates a deteriorating state of health. For example, the processing circuitry may receive signals from measurement circuit indicating a value of the resistance has increased by 50% during a predetermined time period, e.g. from a start time to an end time. The amount of increase may exceed a difference threshold value and the processing circuitry may output a signal indicating the SOH of device 204. Processing circuitry may continue to receive measurement signals from measurement circuitry 202 during a time when the IC 250 is performing the one or more circuit operations outside the test environment and in addition to any BIST or other test indications from device 204.

Figure 3:
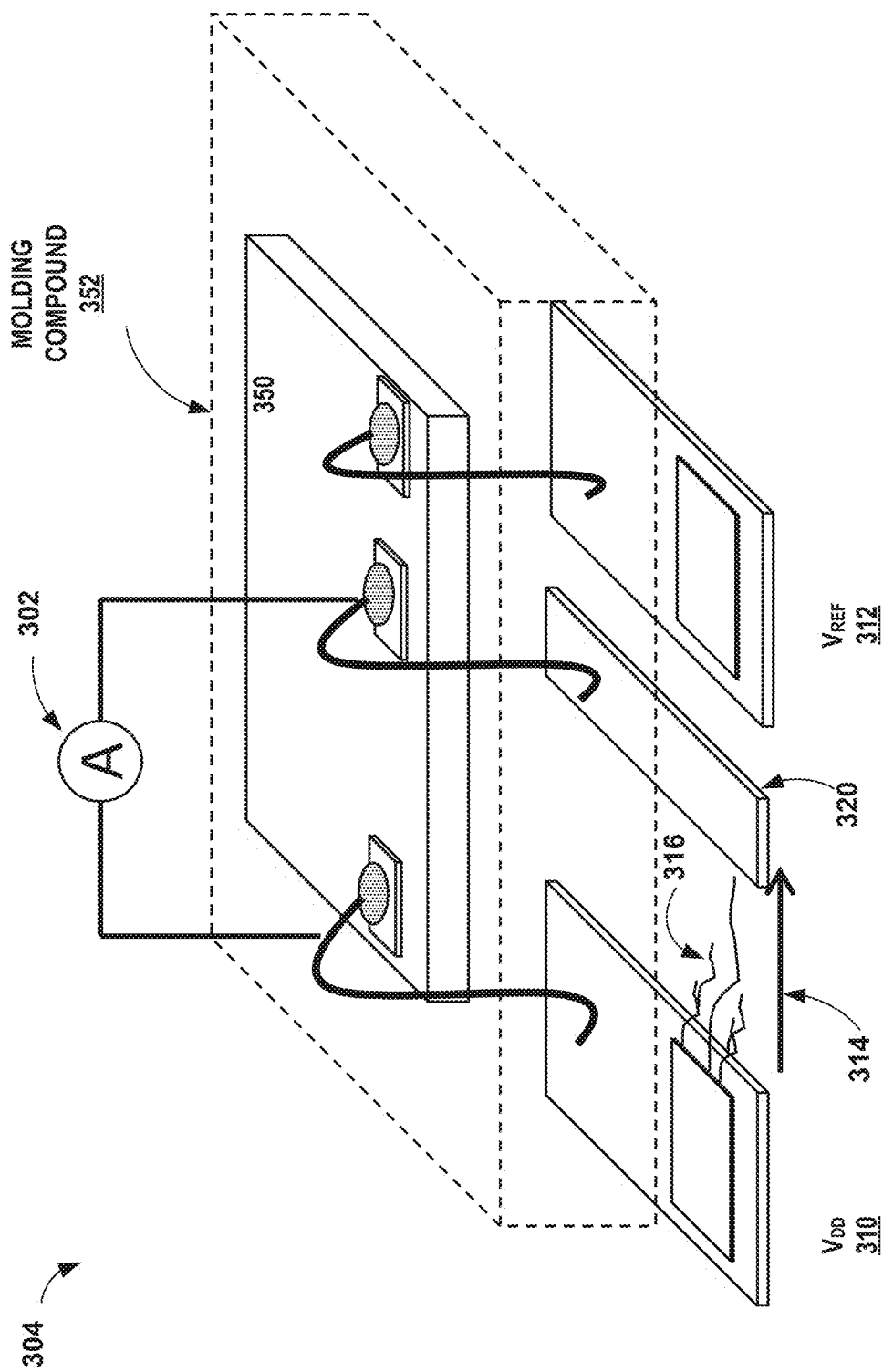
FIG. 3 is a conceptual diagram illustrating another example of measuring an electrical characteristic between terminals of an IC according to one or more techniques of this disclosure.

FIG. 3 is a conceptual diagram illustrating another example of measuring an electrical characteristic between terminals of an IC according to one or more techniques of this disclosure. Device 304 and measurement circuitry 302 are examples of devices 104 and 204 as well as measurement circuitry 102 and 202 described above in relation to FIGS. 1 and 2. The example of FIG. 3 depicts device 304, IC 350, external terminals Vdd 310, Vref 312, which are protected by IC molding compound 352, and measurement circuitry 302. The functions and characteristics of device 304, IC 350, external terminals Vdd 310, Vref 312, molding compound 352, metal migration 316, leakage current 314, and measurement circuitry 302 may be the same or similar to device 204, IC 250, external terminals Vdd 210, Vref 212, molding compound 252, metal migration 216, leakage current 214 and measurement circuitry 202.

Device 304 includes external terminal 320 connected to measurement circuitry 302. In some examples terminal 320 may be an additional terminal added to device 304 specifically to help determine a SOH of device 304. In other examples, terminal 320 may be a functional terminal configured to conduct electrical signals between one or more functional blocks of IC 350 during normal operation in the field. In some examples, terminal 320 may be located in an area of device 304 that is subject to increased metal migration 316, or subject to increased mechanical stress, such as corner terminal 156 described above in relation to FIG. 1.

Measurement circuitry 302 may be configured to measure one or more electrical characteristics between terminal Vdd 310 and terminal 320. In some examples in which device 304 includes measurement circuitry 302, device 304 may be configured to output a signal indicating the measured electrical characteristic while IC 350 is performing the one or more circuit operations in the field. In other examples in which device 304 also includes processing circuitry, device 304 may determine the SOH based on the measured electrical characteristic and output a signal indicating the SOH to system processing circuitry (not shown in FIG. 2) while IC 350 is performing the one or more circuit operations outside of a test environment.

Figure 4:
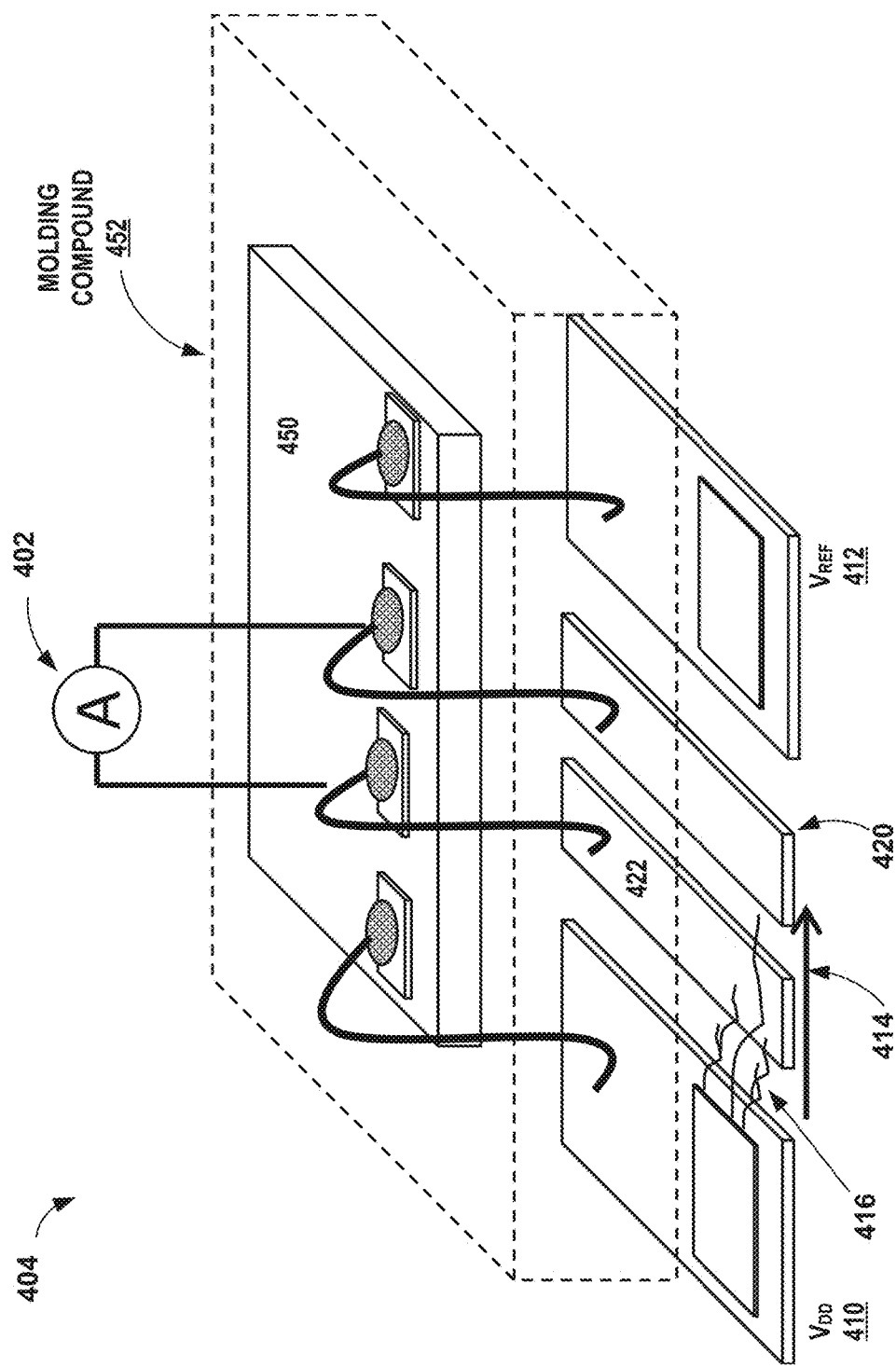
FIG. 4 is a conceptual diagram illustrating an example of multiple additional terminals added to an IC to measure an electrical characteristic between at least two terminals of an IC according to one or more techniques of this disclosure.

FIG. 4 is a conceptual diagram illustrating an example of multiple additional terminals on an IC package to measure an electrical characteristic between at least two terminals of an IC according to one or more techniques of this disclosure. Device 404 and measurement circuitry 402 are examples of devices 104, 204 and 304 as well as measurement circuitry 102, 202 and 302 described above in relation to FIGS. 1-3. The example of FIG. 4 depicts device 404, IC 450, external terminals Vdd 410, Vref 412, which are protected by IC molding compound 452, and measurement circuitry 402. The functions and characteristics of device 404, IC 450, external terminals Vdd 410, Vref 412, molding compound 452, metal migration 416, leakage current 414, and measurement circuitry 402 may be the same or similar to device 204, IC 250, external terminals Vdd 210, Vref 212, molding compound 252, metal migration 216, leakage current 214 and measurement circuitry 202.

As described above in relation to FIG. 1, measurement circuitry 402 may be configured to connect to internal terminals (not shown in FIG. 4) or any external terminals, such as terminals 106 depicted in FIG. 1. The example of FIG. 4 illustrates measuring electrical characteristics between multiple external terminals to determine the SOH of device 404. In the example of FIG. 4, measurement circuitry 402 is configured to measure electrical characteristics between terminals 422 and 420. Such measurements may include temperature, leakage, resistance and so on. As described above in relation to FIGS. 1-3, a change over time, or a value that exceeds a threshold may provide an indication of the SOH of device 404. Terminal 422 may be a functional terminal in some examples, while in other examples, terminal 422 may be added to device 404 during manufacturing to enable system designers to take measurements.

Figure 5:
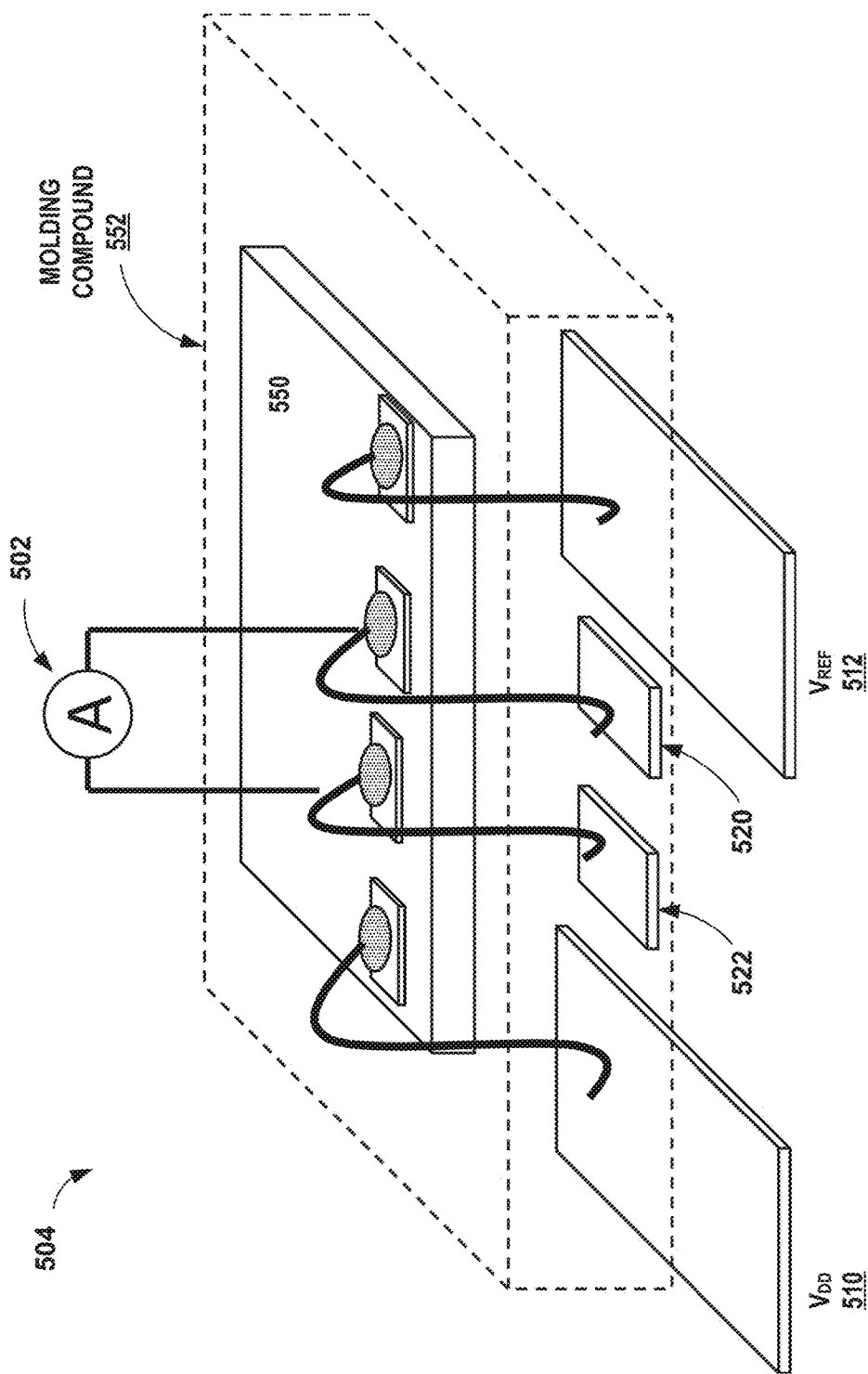
FIG. 5 is a conceptual diagram illustrating another example of an additional terminal added internally to an IC to measure an electrical characteristic between two terminals of an IC according to one or more techniques of this disclosure.

FIG. 5 is a conceptual diagram illustrating another example of an additional terminal added internally to an IC to measure an electrical characteristic between two terminals of an IC according to one or more techniques of this disclosure. Device 504 and measurement circuitry 502 are examples of devices 104, 204, 304 and 404 as well as measurement circuitry 102, 202, 302 and 402 described above in relation to FIGS. 1-4. The example of FIG. 5 depicts device 504, IC 550, external terminals Vdd 510, Vref 512, which are protected by IC molding compound 552, and measurement circuitry 502. The functions and characteristics of device 504, IC 550, external terminals Vdd 510, Vref 512, molding compound 552, and measurement circuitry 502 may be the same or similar to device 204, IC 250, external terminals Vdd 210, Vref 212, molding compound 252, and measurement circuitry 202.

Device 504 includes internal contacts 522 and 520 connected to measurement circuitry 502. Though not shown in FIG. 5, measurement circuitry 502 may be configured to measure an electrical characteristic between an internal contact, e.g. 522 and 520 and one or more external terminals, e.g. Vdd 510, Vref 512 or any of terminals 106 depicted in FIG. 1.

In some examples in which measurement circuitry 502 is internal to device 504, measurement circuitry 502 may be configured to connect directly, or in some examples through a multiplexor (not shown in FIG. 5) to any one or more of the external terminals or internal contacts. In other examples, in which measurement circuitry 502 is external to device 504, measurement circuitry 502 may be configured to connect to one or more of internal contacts 522 and 520 via an external terminal electrically routed to the internal contact within IC 550 (not shown in FIG. 5).

In some examples, electrical characteristics of internal contacts, or a combination of internal contacts and external terminals, may enable a system to detect long-term induced degradation of package materials caused by the field environment. For example, molding materials and glues, as well as metal plating may be affected by humidity penetrating the IC package causing delamination, voids and other defects as well possibly accelerate corrosion effects inside the IC package. In some examples measurement circuitry 502 may be able to detect delamination and other defects by measuring AC impedance or other electrical characteristics, which may not be detectable by other types of tests, such as BIST.

Figure 6:
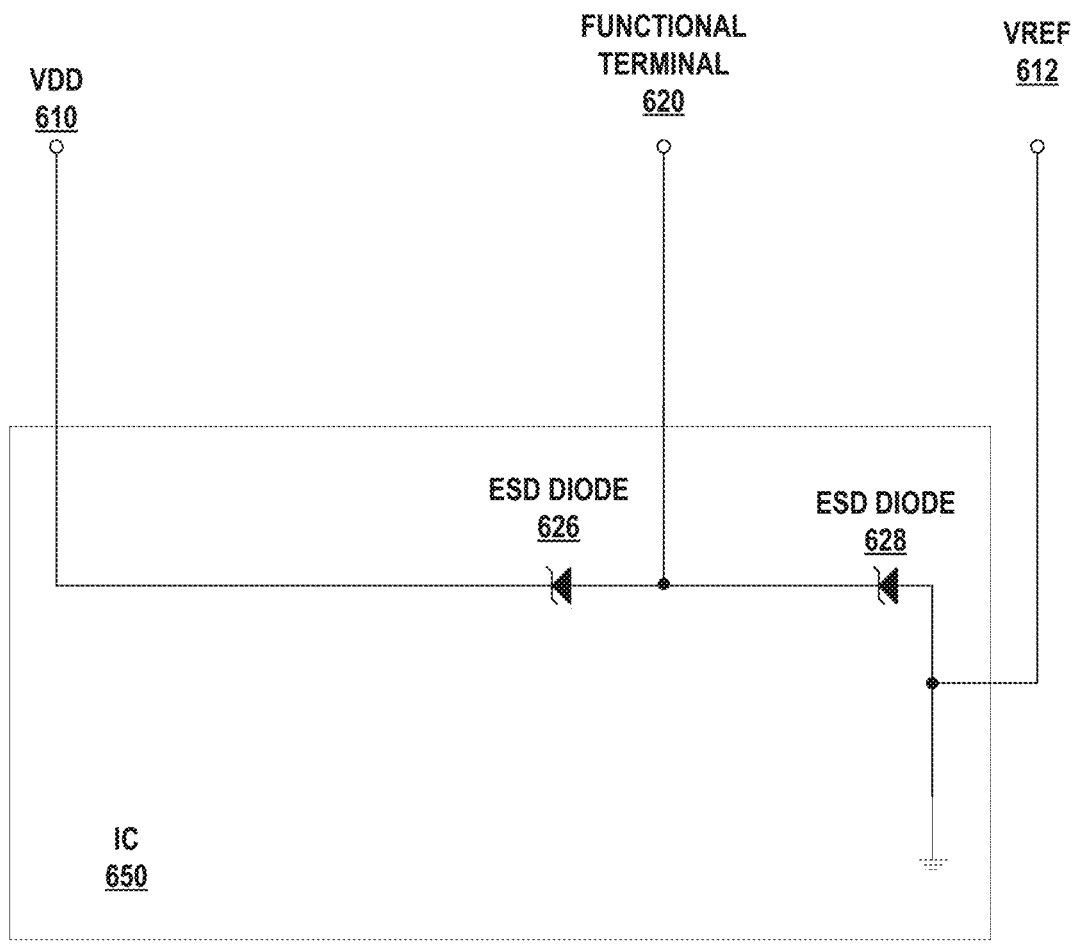
FIG. 6 is s schematic diagram illustrating an example configuration of ESD diodes in an IC, which may be used to measure one or more electrical characteristics according to one or more techniques of this disclosure.

FIG. 6 is s schematic diagram illustrating an example configuration of ESD diodes in an IC, which may be used to measure one or more electrical characteristics according to one or more techniques of this disclosure. The example of FIG. 6 depicts, IC 650, external terminals Vdd 610, Vref 612, and functional terminal 620. The functions and characteristics of IC 650, external terminals Vdd 610, Vref 612, and functional terminal 620 may be the same or similar to IC 250, external terminals Vdd 210, Vref 212, and external terminals 410 and 420 described above in relation to FIGS. 2 and 4. Measurement circuitry, such as measurement circuitry 102 depicted in FIG. 1, may connect to any of external terminals Vdd 610, Vref 612, and functional terminal 620 as well as any internal terminals of IC 650 (not shown in FIG. 6).

In the example of FIG. 6, Vdd 610 connects to the cathode of ESD diode 626. The anode of ESD diode 626 connects to the cathode of ESD diode 628 as well as functional terminal 620. The anode of ESD diode 628 connects to a signal ground as well as Vref 612. In some examples, functional terminal 620 may also electrically connect to one or more functional blocks within IC 650 (not shown in FIG. 6). Similarly, Vdd 610 and Vref 612 may also connect to one or more functional blocks within IC 650.

In some examples, measurement circuitry may measure an electrical characteristic between, for example Vdd 610 and functional terminal 620. In some examples, the electrical characteristic is an impedance, and the device is configured to measures the impedance of the ESD diodes by applying a reverse supply voltage. In other examples, measurement circuitry may determine a temperature of IC 650 near ESD diode 626 based on a diode property that will produce voltage variations in response to changes in ambient temperature. The measured temperature, or a change in temperature over time, may provide an indication of the state of health of IC 650. In other examples, processing circuitry may use the measured temperature may use the measured temperature to make adjustments to other electrical characteristics. For example, measured resistance may change based on temperature, therefore the processing circuitry may correct measured resistance based on the measured temperature.

Figure 7:
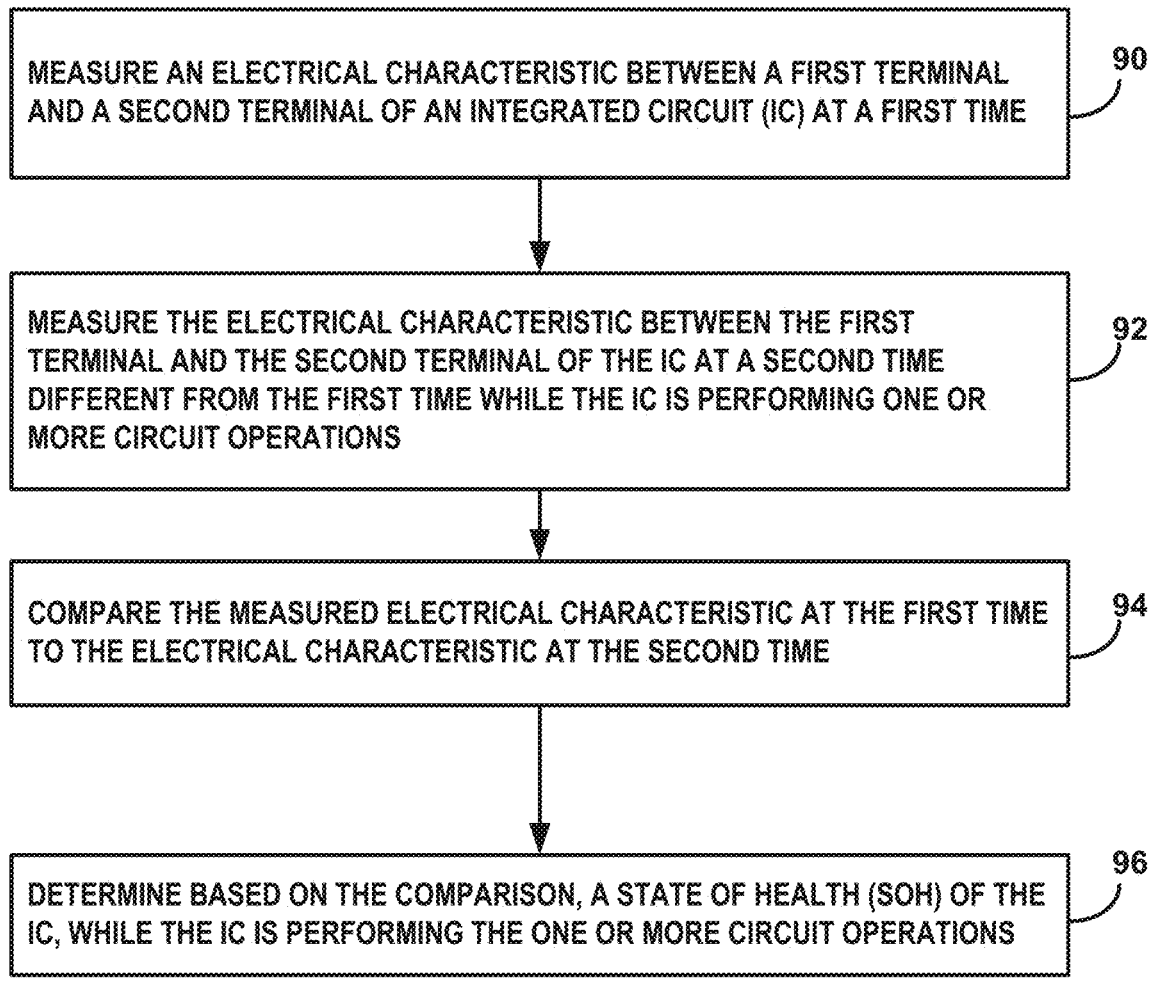
FIG. 7 is a flow diagram illustrating an example operation of the system for measuring an electrical characteristic of this disclosure.

FIG. 7 is a flow diagram illustrating an example operation of the system for measuring an electrical characteristic of this disclosure. The blocks of FIG. 7 will be described in terms of FIG. 1, unless otherwise noted.

A measuring circuit, e.g. measurement circuitry 102, may be configured to measure an electrical characteristic between a first terminal, e.g. terminal 110, and a second terminal, e.g. terminal 112 of device 104 including IC 150 (90). In some examples, the measuring circuit may take the measurement at a first time, and based on the measurement, determine a SOH of device 104. In other examples, the measuring circuit may provide the value of the electrical characteristic to be stored at a memory location, e.g. memory 122, for processing circuitry to track a trend of the electrical characteristic. As described above in relation to FIGS. 1-6, the terminals of the IC configured may be configured to provide electrical connections to the IC to and from other terminals within system 100 (not shown in FIGS. 1 and 7). In other examples, the measurement circuit may connect to internal terminals as described above in relation to FIG. 5. In contrast to measurement circuits, such as automated test equipment, that may take similar measurements during manufacturing, the measurement circuits of this disclosure may be configured to also measure electrical characteristics while the IC is configured to perform one or more circuit operations in the field.

The measuring circuit may also measure the electrical characteristic between the first terminal and the second terminal of the IC at a second time different from the first time (92). A duration between the first time and the second time may be any period such as from nanoseconds to days, weeks and so on.

Processing circuitry may compare the measured electrical characteristic at the first time to the electrical characteristic at the second time (94). In some examples, the difference between the value of the electrical characteristic may be approximately zero, where "approximately zero" means the values are the same within measurement tolerances.

The processing circuitry may determine, based on the comparison, a state of health of IC 150, while IC 150 is performing the one or more circuit operations (96). In some examples, a difference of approximately zero may provide a first indication of the state of health of IC 150, such as that IC 150 is functioning normally. In other examples, a difference between the first and second values that exceed a threshold may indicate an impending malfunction. In other examples a variability in the values over time that exceeds a variability threshold may also provide an indication of the state of health. The techniques of this disclosure enable system designers to determine and act on a wide variety of indicators for the state of health of a device, according to one or more techniques of this disclosure.

In one or more examples, the functions described above may be implemented in hardware, software, firmware, or any combination thereof. For example, the various components of FIGS. 1-6 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs, or other equivalent integrated or discrete logic circuitry. Accordingly, the term "processor," as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an IC or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described The techniques of this disclosure may also be described in the following examples.

Example 1. A device comprising an integrated circuit (IC) configured to perform one or more circuit operations, and a plurality of external terminals including a first terminal and a second terminal. The plurality of external terminals is configured to provide electrical connections to the IC, and to provide a measurement of an electrical characteristic between the first terminal and the second terminal while the IC is performing the one or more circuit operations, and wherein the measured electrical characteristic indicates a state of health (SOH) of the device.

Example 2. The device of example 1, wherein the first terminal and the second terminal are each a functional terminal configured to conduct electrical signals between one or more functional blocks of the IC while the IC is performing the one or more circuit operations outside of a test environment.

Example 3. The device of any of examples 1-2 or any combination thereof, wherein the electrical characteristic determines one or more of a voltage, a current, an impedance and a temperature.

Example 4. The device of any combination of examples 1-3, further comprising a measurement circuit, wherein the measurement circuit is configured to electrically connect to the first terminal and the second terminal, wherein the measurement circuit is configured to measure the electrical characteristic, and wherein the device is configured to output a signal indicating the measured electrical characteristic while the IC is performing the one or more circuit operations Example 5. The device of any combination of examples 1-4, further comprising processing circuitry configured to: receive a signal from the measurement circuit indicating a value of the electrical characteristic, determine the SOH based on the measured electrical characteristic, and output a signal indicating the SOH while the IC is performing the one or more circuit operations.

Example 6. The device of any combination of examples 1-5, wherein the processing circuitry is configured to: receive a signal from the measurement circuit at a first time indicating a first value of the electrical characteristic, receive a signal from the measurement circuit at a second time indicating a second value of the electrical characteristic, wherein the SOH comprises a difference between the electrical characteristic at the first time and the second time.

Example 7. The device of any combination of examples 1-6, further comprising an encapsulant configured to seal the IC such that the plurality of external terminals provides the only electrical connections to the IC.

Example 8. The device of any combination of examples 1-7, wherein the device is a circuit package comprising the IC and the plurality of external terminals.

Example 9. The device of any combination of examples 1-8, wherein the electrical characteristic is a first electrical characteristic, the device further comprising an internal terminal configured to provide a measurement of a second electrical characteristic between the first terminal and the internal terminal, wherein the measured second electrical characteristic determines an amount of leakage between the first terminal and the internal terminal.

Example 10. The device of any combination of examples 1-9, wherein the SOH is based on a first amount of leakage between the first terminal and the internal terminal at the first time and a second amount of leakage between the first terminal and the internal terminal at a second time different from the first time.

Example 11. The device of any combination of examples 1-10, wherein the device comprises the IC and the external terminals are defined by a leadframe coupled to the IC.

Example 12. The device of any combination of examples 1-11, wherein the SOH is based on a first impedance between the first terminal and the second terminal of the device at a first time and a second impedance between the first terminal and the second terminal of the device at a second time different from the first time.

Example 13. The device of any combination of examples 1-12, wherein the impedance is an alternating current (AC) impedance.

Example 14. The device of any combination of examples 1-13, further comprising an electro-static discharge (ESD) diode coupled to the first terminal, wherein the electrical characteristic is an impedance, and the device is configured to measures the impedance of the ESD diodes by applying a reverse supply voltage.

Example 15. The device of any combination of examples 1-14, wherein the device is configured to measure the resistance by running a test program triggered by a signal external to the device.

Example 16. The device of any combination of examples 1-15, wherein the SOH is based on an amount of leakage between the first terminal and the second terminal.

Example 17. A method comprising: measuring, by a measuring circuit, an electrical characteristic between a first terminal and a second terminal of an integrated circuit (IC) at a first time. The first terminal and the second terminal are terminals of the IC configured to provide electrical connections to the IC, and wherein the IC is configured to perform one or more circuit operations. The method further comprises measuring, by a measuring circuit, the electrical characteristic between the first terminal and the second terminal of the IC at a second time different from the first time, comparing the measured electrical characteristic at the first time to the electrical characteristic at the second time, and determining, based on the comparison, a state of health (SOH) of the IC, while the IC is performing the one or more circuit operations.

Example 18. The method of example 17, wherein the measuring circuit is included in the IC.

Example 19. The method of any combination of examples 17-18, wherein the measured electrical characteristic determines one or more of a voltage, a current, an impedance and a temperature.

Example 21. A system comprising: an integrated circuit (IC) device configured to perform one or more circuit operations, the IC device comprising a plurality of external terminals including a first terminal and a second terminal. The plurality of external terminals is configured to provide electrical connections to the integrated circuit and the first terminal of the plurality of terminals is configured to provide a measurement of an electrical characteristic between the first terminal and the second terminal while the IC is performing the one or more circuit operations. The measured electrical characteristic indicates a state of health (SOH) of the device. The system further comprises a measuring circuit configured to determine the electrical characteristic, wherein the electrical characteristic determines one or more of a voltage, a current, an impedance and a temperature.

Example 22. The system of example 21, wherein further comprising processing circuitry configured to: determine the electrical characteristic at a first time determine the electrical characteristic at a second time different from the first time, and determine the SOH based on a difference between the measured electrical characteristic at the first time and at the second time.

Example 23. The system of any combination of examples 21 and 22, wherein the processing circuitry is external to the IC.

Various examples of the disclosure have been described. These and other examples are within the scope of the following claims.

What is claimed is:

1. A device comprising:
    a circuit configured to perform one or more circuit operations; and
    a plurality of terminals including a first terminal and a second terminal, wherein the plurality of terminals comprises one or more external terminals configured to provide electrical connections to the circuit,
        wherein the first terminal of the plurality of terminals is an external terminal of the one or more external terminals and is configured to electrically connect to a measurement circuit,
        wherein the measurement circuit is configured to output a first signal at a first time indicating a measurement of a first value of an electrical characteristic between the first terminal and the second terminal while the circuit is performing the one or more circuit operations,
        wherein the measurement circuit is configured to output a second signal at a second time indicating a second value of the electrical characteristic between the first terminal and the second terminal, and
        wherein a difference between the first value and the second value of the measured electrical characteristic indicates a state of health (SOH) of the device.

2. The device of claim 1,
    wherein the second terminal is another external terminal of the one or more external terminals, and
    wherein the first terminal and the second terminal are each a functional terminal configured to conduct electrical signals to one or more functional blocks of the circuit while the circuit is performing the one or more circuit operations outside of a test environment.

3. The device of claim 1, wherein the the first signal and the second signal provide an indication of one or more of a voltage, a current, an impedance and a temperature.

4. The device of claim 1, wherein the circuit comprises the measurement circuit.

5. The device of claim 4, further comprising processing circuitry configured to:
    receive the first signal from the measurement circuit indicating the first value of the electrical characteristic;
    receive the second signal from the measurement circuit indicating the second value of the electrical characteristic;
    determine the SOH based on the first value and the second value of the measured electrical characteristic; and
    output a third signal indicating the SOH while the circuit is performing the one or more circuit operations.

6. The device of claim 1, wherein the device is a circuit package comprising the circuit and the plurality of external terminals.

7. The device of claim 1,
    wherein the second terminal is an internal terminal, and
    wherein the measured first value and the second value of the electrical characteristic determines an amount of leakage between the first terminal and the internal second terminal at the first time and at the second time, respectively.

8. The device of claim 1, wherein the device comprises the circuit and the external terminals are defined by a leadframe coupled to the circuit.

9. The device of claim 1, wherein the SOH is based on a first impedance between the first terminal and the second terminal of the device at a first time and a second impedance between the first terminal and the second terminal of the device at a second time different from the first time.

10. The device of claim 9, wherein the first impedance is an alternating current (AC) impedance.

11. The device of claim 1, further comprising an electrostatic discharge (ESD) diode coupled to the first terminal, wherein the electrical characteristic is an impedance, and the device is configured to measures the impedance of the ESD diodes by applying a reverse supply voltage.

12. The device of claim 11, wherein the device is configured to measure the impedance by running a test program triggered by a signal external to the device.

13. The device of claim 1, wherein the SOH is based on an amount of leakage between the first terminal and the second terminal.

14. A method comprising:
    measuring, by a measuring circuit, an electrical characteristic between a first terminal and a second terminal of a circuit at a first time,
        wherein the first terminal and the second terminal are terminals of the circuit configured to provide electrical connections to the circuit, and
        wherein the circuit is configured to perform one or more circuit operations;
    measuring, by the measuring circuit, the electrical characteristic between the first terminal and the second terminal of the circuit at a second time different from the first time;

at the first time, outputting, by the measuring circuit, a first signal indicating a first value of the electrical characteristic;

at the second time, outputting, by the measuring circuit, a second signal indicating a second value of the electrical characteristic;

comparing, by processing circuitry, the first value of the measured electrical characteristic at the first time to the second value of the electrical characteristic at the second time; and while the circuit is performing the one or more circuit operations, determining, by the processing circuitry and based on the comparison, a state of health (SOH) of the circuit.

15. The method of claim 14, wherein the circuit comprises the measuring circuit.

16. The method of claim 14, wherein the first signal and the second signal provide an indication of one or more of a voltage, a current, an impedance and a temperature.

17. A system comprising:
a circuit package configured to perform one or more circuit operations, the circuit package comprising:
an integrated circuit comprising one or more semiconductors;
a measuring circuit configured to determine the electrical characteristic, wherein the electrical characteristic determines one or more of a voltage, a current, an impedance and a temperature; and
a plurality of terminals including a first terminal and a second terminal,
wherein the plurality of terminals comprises one or more external terminals configured to provide electrical connections to the integrated circuit;
wherein the first terminal of the plurality of terminals is an external terminal of the one or more external terminals and is configured to electrically connect to the measuring circuit,
wherein the measuring circuit is configured to output a first signal at a first time indicating a measurement of a first value of an electrical characteristic between the first terminal and the second terminal while the circuit device is performing the one or more circuit operations, and
wherein the measuring circuit is configured to output a second signal at a second time indicating a second value of the electrical characteristic between the first terminal and the second terminal,
wherein a difference between the first value and the second value of the measured electrical characteristic indicates a state of health (SOH) of the circuit device.

18. The system of claim 17, further comprising processing circuitry configured to:
receive the first signal and the second signal;
determine the electrical characteristic at the first time;
determine the electrical characteristic at the second time different from the first time; and
determine the SOH based on a difference between the value of the measured electrical characteristic at the first time and at the second time.

19. The system of claim 18, wherein the processing circuitry is external to and separate from the circuit package.

* * * * *